United States Patent
Ahmadi et al.

(10) Patent No.: US 12,155,980 B2
(45) Date of Patent: Nov. 26, 2024

(54) HEATER WITH MOUNTING PADS FOR MECHANICAL, THERMAL, AND OPTO-MECHANICAL FUNCTIONALITY

(71) Applicant: Lumentum Operations LLC, San Jose, CA (US)

(72) Inventors: Roozbeh Ahmadi, Ottawa (CA); Nenad Duricic, Ottawa (CA); Shane H. Woodside, Ottawa (CA)

(73) Assignee: Lumentum Operations LLC, San Jose, CA (US)

( * ) Notice: Subject to any disclaimer, the term of this patent is extended or adjusted under 35 U.S.C. 154(b) by 166 days.

(21) Appl. No.: 17/651,958

(22) Filed: Feb. 22, 2022

(65) Prior Publication Data

US 2023/0164467 A1   May 25, 2023

Related U.S. Application Data

(60) Provisional application No. 63/264,523, filed on Nov. 24, 2021.

(51) Int. Cl.
*H04Q 11/00*   (2006.01)
*G01S 7/481*   (2006.01)
*H05K 7/20*    (2006.01)

(52) U.S. Cl.
CPC ..... *H04Q 11/0005* (2013.01); *H05K 7/20518* (2013.01); *G01S 7/481* (2013.01); *H04Q 2011/0007* (2013.01)

(58) Field of Classification Search
CPC ....... H04Q 11/0005; H04Q 2011/0007; H04Q 2011/0035; H04Q 2011/0052; H04Q 2201/02; H04Q 2201/06; H04Q 2201/10; H04Q 2201/12; H05K 7/20518; G01S 7/481; G02B 5/1814; G02B 6/3584; G02B 6/3582; G02B 6/354; G02B 6/4201
See application file for complete search history.

(56) References Cited

U.S. PATENT DOCUMENTS

| | | | | |
|---|---|---|---|---|
| 10,147,573 | B1 * | 12/2018 | Su ........................ | H01H 37/64 |
| 2019/0094481 | A1 * | 3/2019 | Ahmadi ................ | F28F 27/00 |
| 2019/0393673 | A1 * | 12/2019 | Cao .................... | G01N 15/1404 |
| 2022/0187567 | A1 * | 6/2022 | Vishnia ................ | G02B 7/198 |

* cited by examiner

*Primary Examiner* — Hibret A Woldekidan
(74) *Attorney, Agent, or Firm* — Harrity & Harrity, LLP

(57) ABSTRACT

An optical device may include an outer box. The optical device may include an inner box within the outer box. The optical device may include a heating element on a surface of the inner box. The heating element may include one or more openings. The optical device may include one or more mounting pads. A mounting pad of the one or more mounting pads may be arranged in an opening of the one or more openings and mechanically couple the inner box to the outer box through the opening.

20 Claims, 5 Drawing Sheets

HEATER WITH MOUNTING PADS FOR MECHANICAL, THERMAL, AND OPTO-MECHANICAL FUNCTIONALITY

CROSS-REFERENCE TO RELATED APPLICATION

This Patent Application claims priority to U.S. Provisional Patent Application No. 63/264,523, filed on Nov. 24, 2021, and entitled "HEATER WITH MOUNTING PADS FOR MECHANICAL, THERMAL, AND OPTO-MECHANICAL FUNCTIONALITY." The disclosure of the prior Application is considered part of and is incorporated by reference into this Patent Application.

TECHNICAL FIELD

The present disclosure relates generally to a heating element for an optical device and, more particularly, to a heating element with a mounting pad arranged in an opening in the heating element.

BACKGROUND

An optical device, such as a wavelength selective switch (WSS) or a light detection and ranging (LIDAR) device, may need to satisfy thermal requirements, mechanical/dynamic requirements, or opto-mechanical requirements, within a limited size and/or cost constraint. For example, in operation, an optical device may need to maintain a relatively constant temperature within an inner volume of the optical device. Further, an inner box of the optical device may need to be mechanically coupled to an outer box, with mechanical damping in between. Additionally, the inner box may need to be thermally isolated from the outer box. Finally, the size or volume of the optical device may need to be limited, meaning that the size or volume of the optical device may need to be minimized as much as possible.

SUMMARY

According to some implementations, an optical device may include an outer box; an inner box within the outer box; a heating element on a surface of the inner box, wherein the heating element includes one or more openings; and one or more mounting pads, wherein a mounting pad of the one or more mounting pads is arranged in an opening of the one or more openings and mechanically couples the inner box to the outer box through the opening.

According to some implementations, an optical package may include an inner box; a heating element including an opening, wherein the heating element is on a surface of the inner box; and a mounting pad mechanically coupling the inner box to an outer box, wherein the mounting pad is arranged such that the mounting pad passes through the opening in the heating element.

According to some implementations, a device may include a heating element on a surface of an inner box, wherein the heating element includes a plurality of openings; and a plurality of mounting pads coupling the inner box to an outer box, wherein a mounting pad of the plurality of mounting pads mechanically couples the inner box to the outer box through an opening of the plurality of openings.

DETAILED DESCRIPTION

Figure 1:
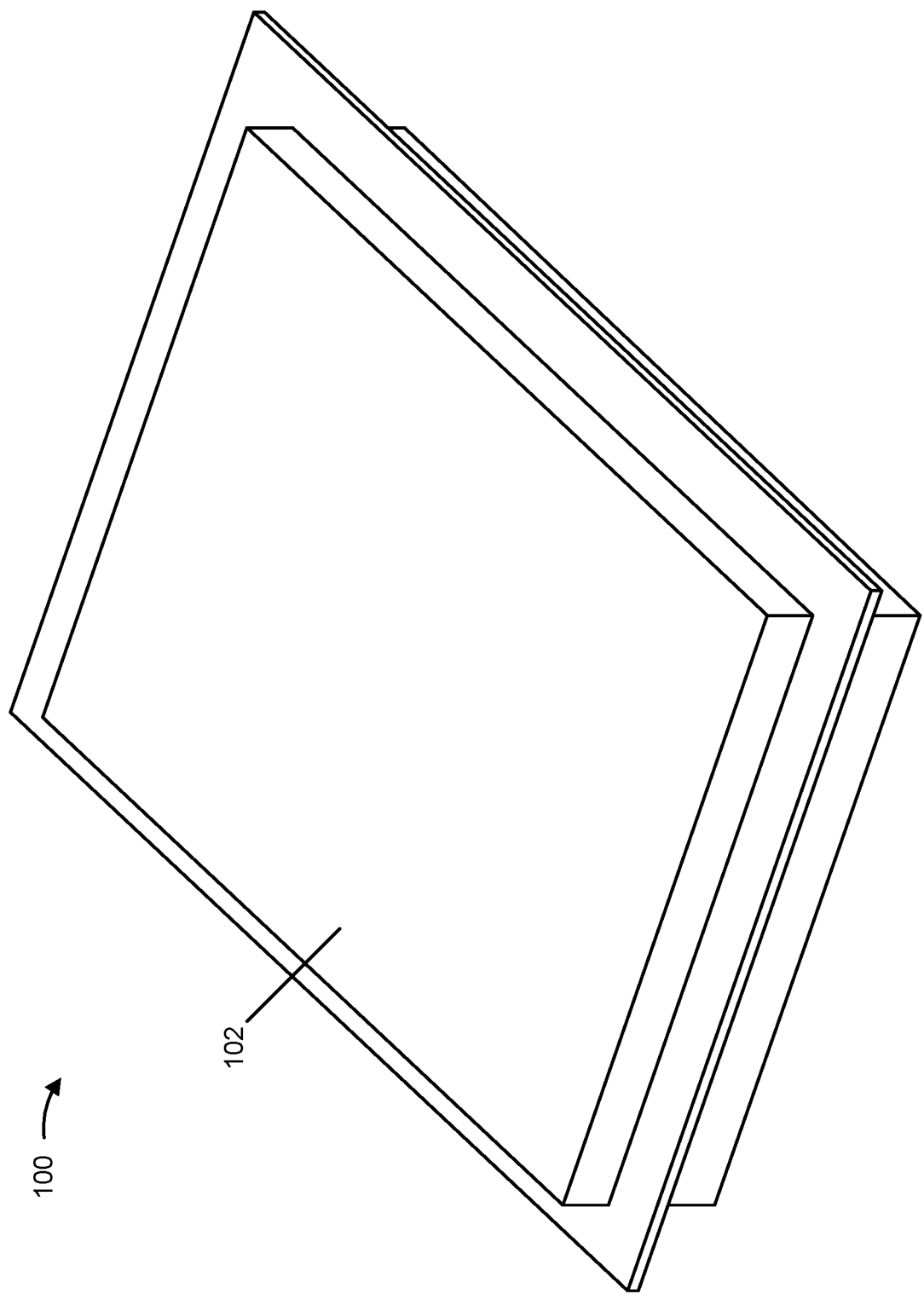
FIGS. 1-5 are diagrams associated with an optical device that includes a heating element with one or more openings in which one or more mounting pads are arranged, in accordance with various aspects of the present disclosure.

The following detailed description of example implementations refers to the accompanying drawings. The same reference numbers in different drawings may identify the same or similar elements.

In general, an optical device may include an inner volume, an inner box, and an outer box. As used herein, the term "inner volume" refers to a volume or space of an optical device in which optical components (e.g., optics) are located. As used herein, the term "inner box" refers to a structure that defines the inner volume (e.g., a structure within which the inner volume is contained). For example, the inner box may include a platform and one or more sidewalls (e.g., arranged at one or more edges of the platform). Here, the platform and the one or more sidewalls define a volume within which the optical components of the optical device can be mounted. The inner box may also provide an isothermal enclosure for the optical components of the optical device. As used herein, the term "outer box" refers to a structure within which the inner box is contained. The outer box may be designed to provide a hermetic seal and thermal insulation for the optical device.

As noted above, an optical device, such as a WSS or a LIDAR device, may need to satisfy thermal requirements, mechanical/dynamic requirements, or opto-mechanical requirements, within a limited size and/or cost constraint. In some optical devices, to provide mechanical coupling and isolation at the same time, the optical device may include one or more mounting pads (also referred to as damping pads) between the inner box and the outer box (e.g., such that the inner box is mechanically coupled to the outer box via the mounting pads). Further, to maintain a relatively constant temperature within the inner volume, the inner box may include one or more heating elements (i.e., a film heater) on one or more surfaces of the inner box. The one or more heating elements may enable a relatively constant temperature to be maintained in the inner volume. However, the need for the inner box to be mechanically coupled to, and thermally isolated from, the outer box is problematic due to the one or more heating elements because mounting the mounting pads directly on the heating element results in unreliable mechanical coupling and decreased thermal isolation.

Some implementations described herein provide an optical device comprising a heating element with a mounting pad arranged in an opening in the heating element. In some implementations, the design of the heating element, the mounting pad, and/or the opening enables thermal, dynamic, and/or opto-mechanical requirements of the optical device to be satisfied, while also enabling a physical size limitation and/or a material cost limitation to be satisfied. In some implementations, the opening improves reliability of the mechanical coupling between the inner box and the outer box (e.g., since mounting the mounting pads directly on the heating element results in unreliable mechanical coupling), while also facilitating thermal isolation of the inner box from the outer box.

FIGS. 1-5 are diagrams associated with an optical device 100 that includes a heating element with one or more openings in which one or more mounting pads are arranged, as described herein. In some implementations, as illustrated in FIGS. 1-5, the optical device 100 includes an outer box 102, an inner box 104, one or more mounting pads 106, and one or more heating elements 108 including one or more openings 110.

FIG. 1 illustrates an external view of the outer box 102 of the optical device 100. In some implementations, the outer box 102 is a structure within which an inner box 104 is arranged. In some implementations, the outer box 102 provides a hermetic seal and thermal insulation for the optical device 100.

Figure 2:
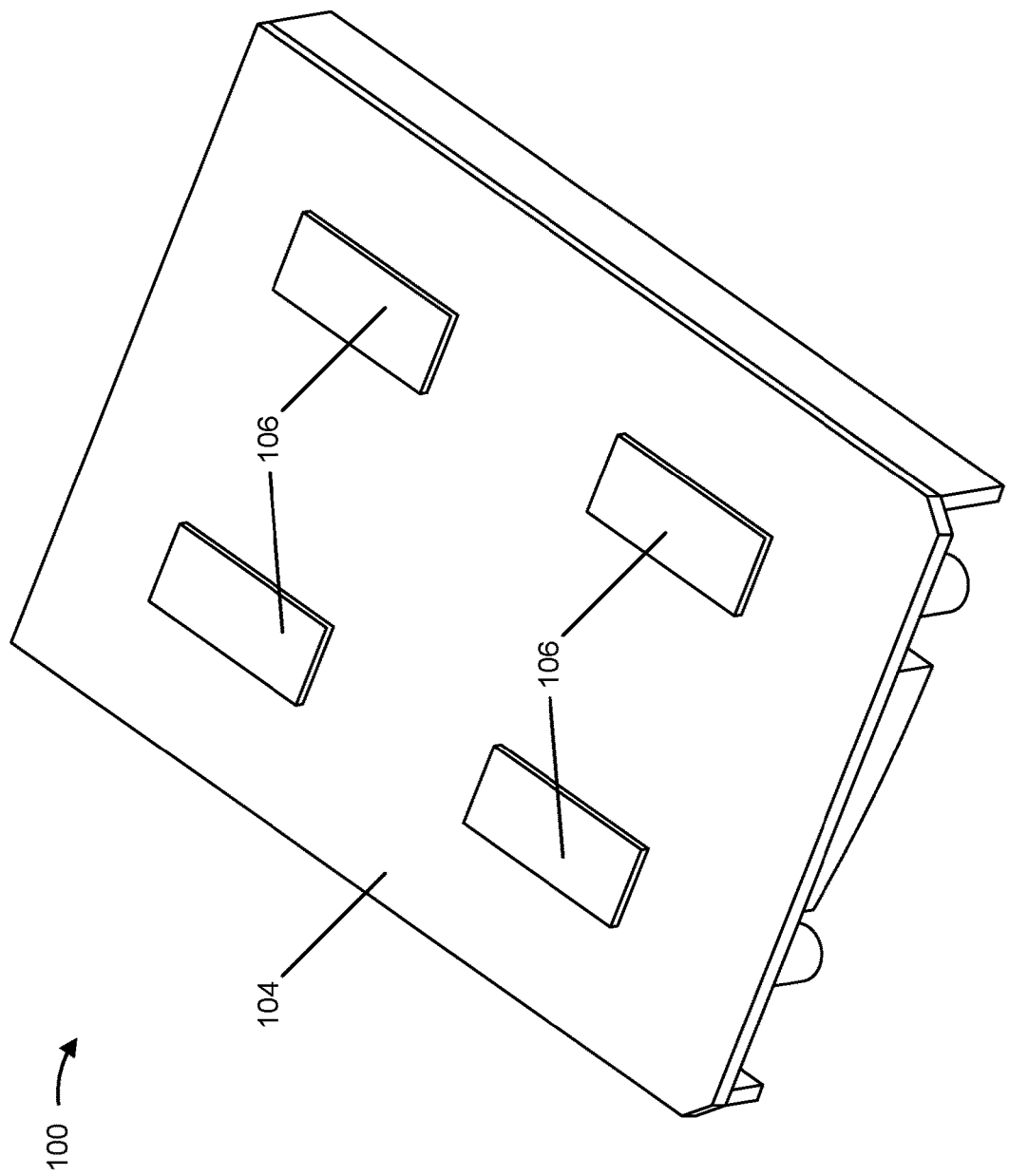

FIG. 2 illustrates an example of the inner box 104 of the optical device 100. As noted above, the inner box 104 may be arranged within the outer box 102 (not shown in FIG. 2). In some implementations, the inner box 104 is a structure that defines an inner volume of the optical device 100 (e.g., a volume of the optical device 100 in which optical components are located). For example, as illustrated in FIG. 2, the inner box 104 may include a platform and a pair of sidewalls. Here, optical components of the optical device 100 may be mounted within an inner volume defined by the platform and the sidewalls of the inner box 104. That is, in the example shown in FIG. 2, the inner box 104 includes a platform and two sidewalls, with optical components of the optical device 100 being mounted in an inner volume that is on an underside of the platform (e.g., between the sidewalls). In some implementations, the inner box 104 provides an isothermal region or enclosure for the optical device 100.

In some implementations, the one or more mounting pads 106 are arranged on one or more surfaces of the inner box 104. For example, in the example optical device 100 shown in FIG. 2, four mounting pads 106 are arranged on a surface of the inner box 104 (e.g., a surface opposite that on which the optical components of the optical device 100 are mounted). In some implementations, the one or more mounting pads 106 mechanically couple the inner box 104 to, and thermally isolate the inner box 104 from, the outer box 102 (not shown in FIG. 2).

In some implementations, the one or more mounting pads 106 are designed to account for a number of considerations. For example, the one or more mounting pads 106 may be designed so that the one or more mounting pads 106 provide sufficient thermal isolation of the (heated) inner box 104 from the outer box 102. As another example, the one or more mounting pads 106 may be designed to provide isolation from other forces, such as a coefficient of thermal expansion (CTE) mismatch between materials, from stress, from strain, or from external forces (e.g., shock, vibration, or the like), among other examples. As another example, the one or more mounting pads 106 may be designed so that a number, size, and locations of the one or more mounting pads 106 are determined by analyzing physical constraints of a package size of the optical device 100, thermal isolation requirements, a required adhesion strength between the mounting pads 106 and the inner box 104 and/or the outer box 102, stress/strain isolation requirements, or external force isolation requirements. In some implementations, a selection of one or more thermal properties (e.g., thermal conductivity) and/or one or more mechanical properties (e.g., a Young's modulus, a dynamic modulus, a damping ratio, or the like) of a material of the one or more mounting pads 106 may take these factors into consideration.

Therefore, in some implementations, one or more characteristics of a mounting pad 106 may be based on a dynamic requirement associated with the optical device 100, a thermal requirement associated with the optical device 100, and/or an opto-mechanical requirement associated with the optical device 100. Such characteristics of the given mounting pad 106 may include, for example, a size of the mounting pad 106 (e.g., a length, a width, a thickness, or the like), a geometry or shape of the mounting pad, a location of the mounting pad 106 on the surface of the inner box 104 (e.g., a location relative to another mounting pad 106, a location relative to an edge of the heating element 108, or the like), or a material property of the mounting pad 106. The material property of the mounting pad may include, for example, a damping ratio, a dynamic modulus as a function of temperature and compression ratio, a thermal conductivity, or a CTE, among other examples. In some implementations, the mounting pad 106 may have a pad geometry (e.g., a thin planar structure, as illustrated in FIG. 2) or may have some other geometry or structure, such as a grommet geometry. In some implementations, one or more characteristics may vary among the mounting pads 106 of the optical device 100.

Figure 3:
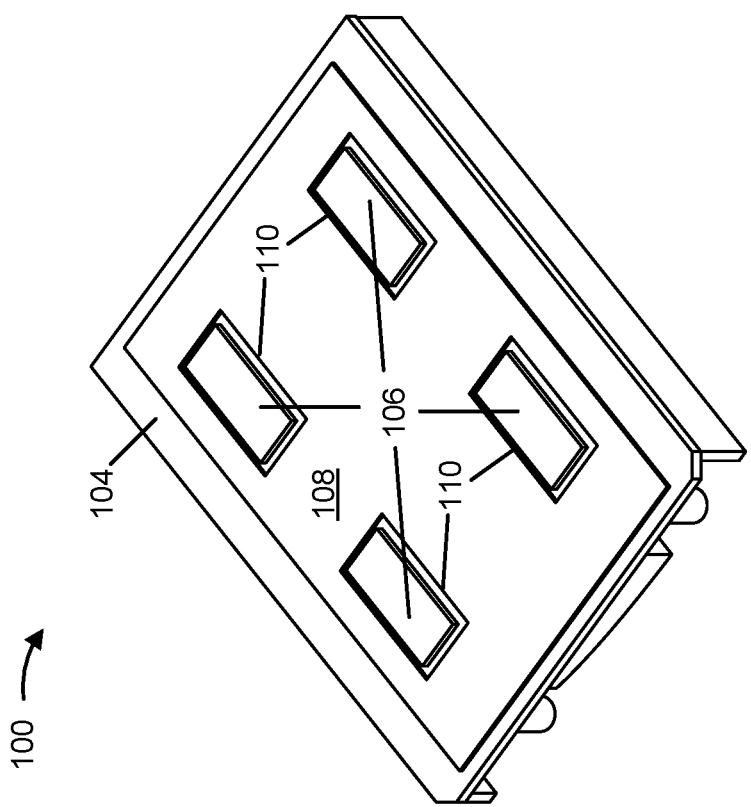
Figure 3:
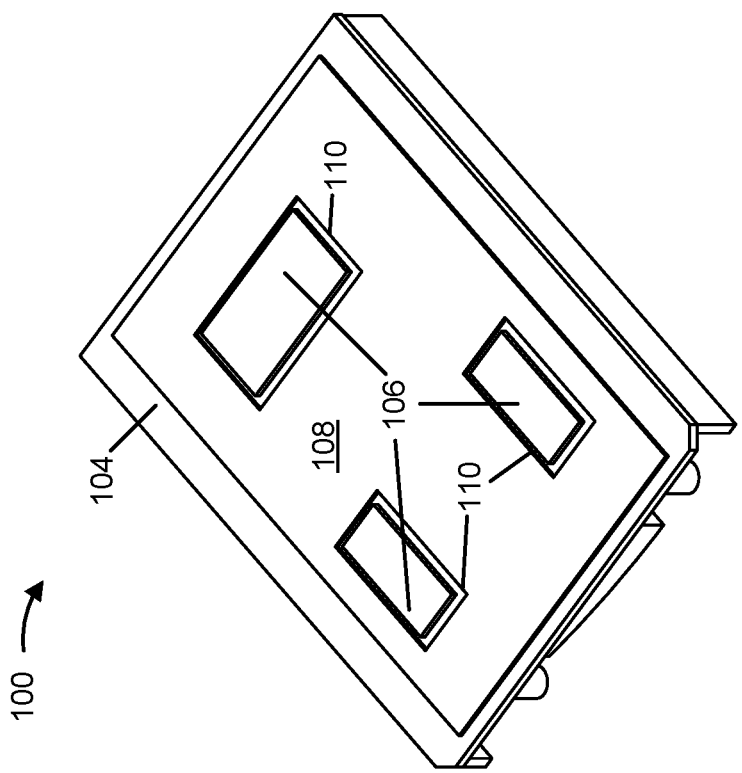

In some implementations, the one or more heating elements 108 are on one or more surfaces of the inner box 104. FIG. 3 illustrates examples of the inner box 104 with a heating element 108 arranged on a surface of the inner box 104. In some implementations, the one or more heating elements include one or more openings 110. For example, as illustrated in the left diagram of FIG. 3, the heating element 108 may include three openings 110, and a mounting pad 106 may be arranged within each of the three openings 110 (e.g., such that the three mounting pads 106 mechanically couple the inner box 104 to the outer box 102 through a respective one of the three openings 110). As another example, as illustrated in the right diagram of FIG. 3, the heating element 108 may include four openings 110, and a mounting pad 106 may be arranged within each of the four openings 110 (e.g., such that the four mounting pads 106 mechanically couple the inner box 104 to the outer box 102 through a respective one of the four openings 110).

In some implementations, the one or more mounting pads 106 and the one or more heating elements 108 including the one or more openings 110 are on a single surface of the inner box 104 (e.g., such that mechanical coupling is provided between the outer box 102 and a single surface of the inner box 104). Alternatively, in some implementations, the one or more mounting pads 106 and the one or more heating elements 108 including the one or more openings 110 may be on multiple (e.g., two, three, four, or the like) surfaces of the inner box 104 (e.g., such that mechanical coupling is provided between the outer box 102 and multiple surfaces of the inner box 104). For example, in some implementations, the optical device 100 may include one or more heating elements 108 on two or more surfaces of the inner box 104. In this example, the inner box 104 includes a second platform (e.g., arranged on the opposite side of the sidewalls from the first platform), and a second heating element 108 may be arranged on a surface of the second platform, with the second heating element 108 including one or more openings 110. Here, one or more mounting pads 106 may be arranged in the one or more openings 110 of the second heating element 108 in order to provide further mechanical coupling of the inner box 104 to the outer box 102 (e.g., such that the inner box 104 is mechanically coupled to the outer box 102 via mounting pads 106 on two opposing surfaces of the inner box 104).

In some implementations, a shape of each of the one or more heating elements 108, a shape of each of the one or more openings 110, a size of each of the one or more openings 110, or a location of each of the one or more openings 110 may be configured for optimization of thermal, dynamic, and opto-mechanical requirements. In some implementations, the optimization may include, for example, minimizing temperature gradients on optics of the optical device 100, minimizing power consumption of the heating element 108, minimizing optical performance sensitivity of the optical device 100 to changes or variation in ambient pressure or temperature, or maximizing impact survivability, among other examples. In some implementations, variables based at least in part on which the optimization can be performed may include, for example, a geometry (e.g., a size, a shape, a location, or the like) of a given heating element 108, a geometry of a given mounting pad 106, a geometry of a given opening 110, one or more material properties of a given mounting pad 106, or a power density distribution on a given heating element 108, among other examples.

Figure 4:
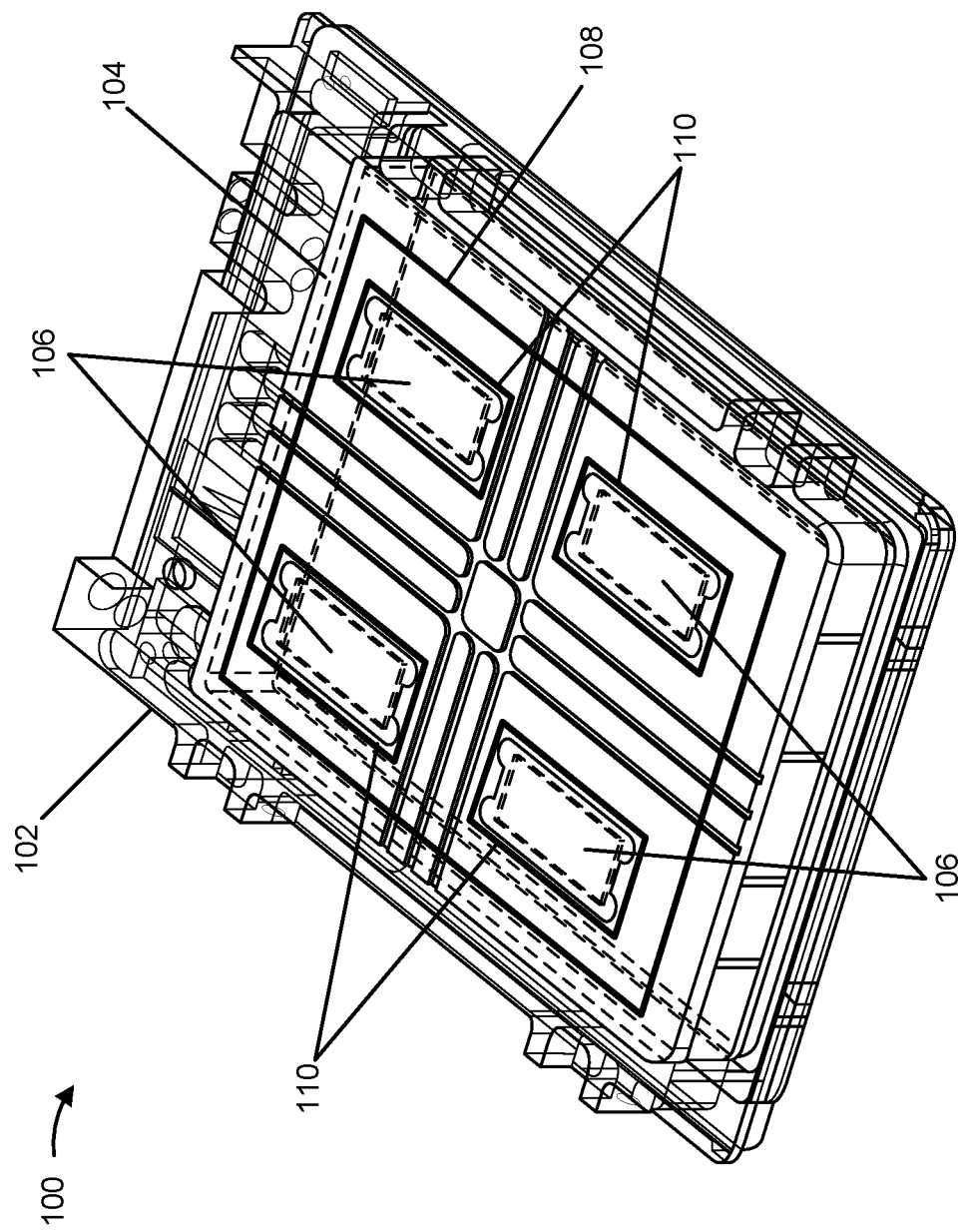

FIG. 4 illustrates a diagram of the 100 showing the inner box 104 with four mounting pads 106 arranged in four openings 110 of a heating element 108 after placement of the inner box 104 in the outer box 102 (the outer box 102 is shown as transparent in FIG. 4).

In this way, one or more heating elements 108 may include one or more openings 110, and the one or more mounting pads 106 may be arranged in the one or more openings 110 to enable the one or more mounting pads 106 to be mounted on the inner box 104, rather than the heating element 108. As a result, the one or more openings 110 improve reliability of the mechanical coupling between the inner box 104 and the outer box 102 (e.g., since mounting the mounting pads 106 directly on the heating element 108 would result in unreliable mechanical coupling), while also providing sufficient thermal isolation of the inner box 104 from the outer box 102 and enabling a physical size limitation and/or a material cost limitation to be satisfied.

In some implementations, a heating element 108 may be a non-unitary heating element. That is, a heating element 108 may have multiple (e.g., physically separate) sections, each of which is mounted on a surface of the inner box 104. In such a case, an opening 110 may be defined as a region between two or more sections of a non-unitary heating element 108 (e.g., a space between two separate sections of the non-unitary heating element 108).

Figure 5:
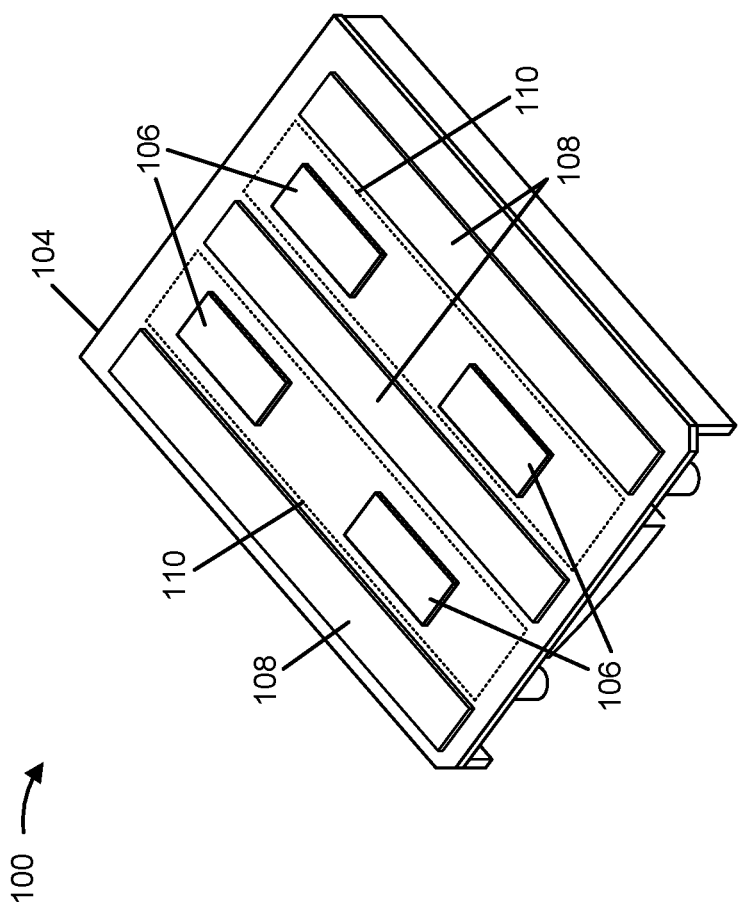

FIG. 5 illustrates an example of the inner box 104 with a non-unitary heating element 108 arranged on a surface of the inner box 104. In the example shown in FIG. 5, the heating element 108 is a non-unitary heating element that includes three sections arranged on the surface of the inner box. Here, regions between adjacent sections of the heating element 108 are defined as openings 110 (indicated with dashed lines in FIG. 5). As further shown, four mounting pads 106 are arranged in the openings 110 (e.g., two mounting pads 106 are arranged in each opening 110).

As indicated above, FIGS. 1-5 are provided as examples. Other examples may differ from what is described with regard to FIGS. 1-5.

Notably, while the techniques and apparatus described herein can be applied in an optical device such as a WSS, or a LIDAR device, these techniques and apparatuses can be applied in another type of optical device with relatively tight optical, mechanical, or thermal requirements. That is, the improved packaging concept for packaging optical and/or opto-electronic components described herein can be applied to a variety of optical devices.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical device, comprising:
   an outer box;
   an inner box within the outer box;
   a heating element on a surface of the inner box, wherein the heating element includes one or more openings; and
   one or more mounting pads, wherein a mounting pad of the one or more mounting pads is arranged in an opening of the one or more openings and provides mechanical coupling between the surface of the inner box and the outer box through the opening.

2. The optical device of claim 1, wherein the mounting pad has a pad geometry.

3. The optical device of claim 1, wherein each of the one or more mounting pads are on a single surface of the inner box.

4. The optical device of claim 1, wherein the heating element is a first heating element, the surface is a first surface, and the optical device includes:
  a second heating element on a second surface of the inner box, the second heating element including at least one opening, and
  at least one mounting pad arranged in the at least one opening of the second heating element, the at least one mounting pad mechanically coupling the second surface of the inner box to the outer box through the at least one opening in the second heating element.

5. The optical device of claim 1, wherein the one or more openings include four openings and the one or more mounting pads include four mounting pads.

6. The optical device of claim 1, wherein a characteristic of the mounting pad is based on a dynamic, thermal, or opto-mechanical requirement of the optical device.

7. The optical device of claim 1, wherein a characteristic of the opening is based on a dynamic, thermal, or opto-mechanical requirement of the optical device.

8. The optical device of claim 1, wherein the optical device is a wavelength selective switch.

9. The optical device of claim 1, wherein the heating element is a non-unitary heating element.

10. An optical package, comprising:
  an inner box;
  a heating element including an opening, wherein the heating element is on a surface of the inner box; and
  a mounting pad mechanically coupling the surface of the inner box to an outer box through the opening, wherein the mounting pad is arranged such that the mounting pad passes through the opening.

11. The optical package of claim 10, wherein the heating element is a first heating element, the opening is a first opening, the mounting pad is a first mounting pad, the surface is a first surface, and the optical package includes:
  a second heating element on a second surface of the inner box, the second heating element including a second opening, and
  a second mounting pad arranged in the second opening such that the second mounting pad passes through the second opening in the second heating element.

12. The optical package of claim 10, wherein the opening is a first opening, and the heating element comprises at least one other opening through which at least one other mounting pad is arranged.

13. The optical package of claim 10, wherein a size of the mounting pad is based on a dynamic, thermal, or opto-mechanical requirement of the optical package.

14. The optical package of claim 10, wherein a size of the opening is based on a dynamic, thermal, or opto-mechanical requirement of the optical package.

15. A device, comprising:
  a heating element on a surface of an inner box, wherein the heating element includes a plurality of openings; and
  a plurality of mounting pads coupling the inner box to an outer box, wherein a mounting pad of the plurality of mounting pads mechanically couples the surface of the inner box to the outer box through an opening of the plurality of openings.

16. The device of claim 15, wherein the heating element and the plurality of mounting pads are on a single surface of the inner box.

17. The device of claim 15, wherein the plurality of openings includes three openings and the plurality of mounting pads includes three mounting pads.

18. The device of claim 15, wherein a location of the mounting pad is based on a dynamic, thermal, or opto-mechanical requirement of the device.

19. The device of claim 15, wherein a location of the opening is based on a dynamic, thermal, or opto-mechanical requirement of the device.

20. The device of claim 15, wherein a material property of the mounting pad or a shape of the mounting pad is based on a dynamic, thermal, or opto-mechanical requirement of the device.

* * * * *